United States Patent
Hsu et al.

(10) Patent No.: US 12,550,509 B2
(45) Date of Patent: Feb. 10, 2026

(54) LIGHT-EMITTING DIODE PACKAGE STRUCTURE, DISPLAY PANEL AND TILING-TYPE DISPLAY DEVICE

(71) Applicant: Xiamen Extremely PQ Display Technology Co., Ltd., Xiamen (CN)

(72) Inventors: Chen-Ke Hsu, Xiamen (CN); Xiangwei Xie, Xiamen (CN); Yong Fan, Xiamen (CN)

(73) Assignee: Xiamen Extremely PQ Display Technology Co., Ltd., Xiamen (CN)

( * ) Notice: Subject to any disclaimer, the term of this patent is extended or adjusted under 35 U.S.C. 154(b) by 375 days.

(21) Appl. No.: 18/340,862

(22) Filed: Jun. 25, 2023

(65) Prior Publication Data

US 2023/0335700 A1 Oct. 19, 2023

Related U.S. Application Data

(63) Continuation of application No. PCT/CN2021/123909, filed on Oct. 14, 2021.

(51) Int. Cl.
| | |
|---|---|
| *H10H 20/857* | (2025.01) |
| *G09G 3/32* | (2016.01) |
| *H01L 25/075* | (2006.01) |
| *H01L 25/13* | (2006.01) |
| *H10H 20/84* | (2025.01) |

(52) U.S. Cl.
CPC ....... *H10H 20/857* (2025.01); *H01L 25/0753* (2013.01); *H01L 25/13* (2013.01)

(58) Field of Classification Search
CPC ........ G09G 2300/0426; H01L 25/0753; H01L 25/13; H10H 20/857
See application file for complete search history.

(56) References Cited

FOREIGN PATENT DOCUMENTS

| | | | |
|---|---|---|---|
| CN | 109860143 A | 6/2019 | |
| CN | 210403726 U | 4/2020 | |
| CN | 111508935 A * | 8/2020 | ........... H10H 20/857 |
| CN | 110783324 B | 3/2021 | |
| CN | 112635530 A | 4/2021 | |

* cited by examiner

*Primary Examiner* — Antonio B Crite
(74) *Attorney, Agent, or Firm* — Hemisphere Law, PLLC

(57) ABSTRACT

A LED package structure, a display panel and a tiling-type display device are provided. The LED package structure includes a package base, light-emitting units and an encapsulant layer. The package base is disposed with solder pads for bonding with a subsequent driving substrate. The light-emitting units include LED chips. The LED package structure has a first edge and an opposite second edge. A distance from a center point position of the light-emitting unit closest to the first edge among the light-emitting units to the first edge is not equal to a distance from a center point position of the light-emitting unit closest to the second edge among the light-emitting units to the second edge. By way of the design of the LED package structure, an edge of the package structure is retracted inwardly and the position of solder pad is moved inwards to provide sufficient space for border bonding.

20 Claims, 8 Drawing Sheets

LIGHT-EMITTING DIODE PACKAGE STRUCTURE, DISPLAY PANEL AND TILING-TYPE DISPLAY DEVICE

TECHNICAL FIELD

The present disclosure relates to the field of solid-state light-emitting device and display technologies, and particularly to a light-emitting diode (LED) package structure, a display panel and a tiling-type display device.

BACKGROUND

A MicroLED chip generally refers to a semiconductor LED chip with a length, a width and a thickness are all less than 100 micrometers (μm). The display technology of using a thin-film transistor active matrix (AM-TFT) to drive MicroLEDs requires the use of tiling technology to form a large-size display screen, and the most mature tiling technology is a border bonding technology. Moreover, an existing MicroLED technology tending to be mature uses a MicroLED package in the form of POG (package on TFT (glass)), which can be mounted on a TFT array substrate.

However, a shortcoming of the border bonding technology is that it needs to occupy a part of a display surface, so that the MicroLED package needs to be designed to be very small in size to meet a process space required by border bonding, but a very small MicroLED package will lead to difficulties in manufacturing and mounting, resulting in poor product stability and high mounting cost. Moreover, for an existing single pixel package, a size of the package is larger than that of a chip, and the single pixel package has chips of RGB three colors, which requires at least four solder pads (i.e., one common cathode and R, G, B three anodes), so that an area of one pixel needs to burden areas of four solder pads. As a result, there is not enough space to reduce an area of the package to leave space required for tiling.

SUMMARY

Accordingly, in order to overcome at least some of drawbacks and deficiencies in the art, embodiments of the present disclosure provide a LED package structure, a display panel and a tiling-type display device, so as to provide sufficient space required for border bonding.

Specifically, in an aspect, an embodiment of the present disclosure provides a light-emitting diode (LED) package structure including: a package base, a plurality of light-emitting units, and an encapsulant layer. A first side of the package base is disposed with a plurality of solder pads, the plurality of light-emitting units are disposed on a second side of the package base opposite to the first side and electrically connected to the plurality of solder pads, the encapsulant layer is arranged on the second side of the package base and covering the plurality of light-emitting units, and each of the plurality of light-emitting units includes LED chips of different colors. The LED package substrate has a first edge and a second edge opposite to the first edge, and a distance from a center point position of the light-emitting unit closest to the first edge among the plurality of light-emitting units to the first edge is not equal to a distance from a center point position of the light-emitting unit closest to the second edge among the plurality of light-emitting units to the second edge.

In an embodiment of the present disclosure, the LED chips of different colors of each of the plurality of light-emitting units are MicroLED chips of different colors, the plurality of light-emitting units are arranged in a M×N array, an amount of the plurality of solder pads is determined by the M, the N and an amount of the LED chips of different colors of each of the plurality of light-emitting units, the M and the M each are a positive integer equal to or greater than 2.

In an embodiment of the present disclosure, the plurality of solder pads are overlapped with some or all of the LED chips of the plurality of light-emitting units.

In an embodiment of the present disclosure, an arrangement of the plurality of solder pads is an asymmetrical arrangement with respect to a geometric center of the LED package structure in a distance direction from the first edge to the second edge.

In another aspect, an embodiment of the present disclosure provides a display panel including: a driving substrate and a plurality of LED package structures mounted on the driving substrate. Each of the plurality of LED package structures includes a package base, a plurality of light-emitting units and an encapsulant layer; a first side of the package base is disposed with a plurality of solder pads, the plurality of light-emitting units are disposed on a second side of the package base opposite to the first side and electrically connected to the plurality of solder pads, the encapsulant layer is arranged on the second side of the package base and covering the plurality of light-emitting units, and each of the plurality of light-emitting units includes LED chips of different colors. The driving substrate has a substrate edge, and a side of the driving substrate near the substrate edge is disposed with a border bonding region; a target LED package structure closest to the substrate edge among the plurality of LED package structures has a first edge facing towards the substrate edge and a second edge opposite to the first edge, the border bonding region is located between the substrate edge and the first edge, and a distance from a center point position of the light-emitting unit closest to the first edge among the plurality of light-emitting units of the target LED package structure to the first edge is smaller than a distance from a center point position of the light-emitting unit closest to the second edge among the plurality of light-emitting units of the target LED package structure to the second edge.

In an embodiment of the present disclosure, a length of a side the target LED package structure perpendicular to the substrate edge is a, a length of another side of the target LED package structure parallel to the substrate edge is b, a distance from the first edge of the target LED package structure to the substrate edge is c, and conditions that (b−a)≤c and a<b are satisfied.

In an embodiment of the present disclosure, a length of a side the target LED package structure perpendicular to the substrate edge is equal to a length of another side of the target LED package structure parallel to the substrate edge.

In an embodiment of the present disclosure, a length of a side the target LED package structure perpendicular to the substrate edge is a, a length of another side of the target LED package structure parallel to the substrate edge is b, and a condition that a>b is satisfied.

In an embodiment of the present disclosure, a second target LED package structure among the plurality of LED package structures farther away from the substrate edge than the target LED packaging structure has a third edge facing towards the substrate edge and a fourth edge opposite to the third edge, and a distance from a center point position of the light-emitting unit closest to the third edge among the plurality of light-emitting units of the second target LED package structure to the third edge is smaller than a distance from a center point position of the light-emitting unit closest to the fourth edge among the plurality of light-emitting units of the second target LED package structure to the fourth edge.

In an embodiment of the present disclosure, a second target LED package structure among the plurality of LED package structures farther away from the substrate edge than the target LED packaging structure has a third edge facing towards the substrate edge and a fourth edge opposite to the third edge, and a distance from a center point position of the light-emitting unit closest to the third edge among the plurality of light-emitting units of the second target LED package structure to the third edge is equal to a distance from a center point position of the light-emitting unit closest to the fourth edge among the plurality of light-emitting units of the second target LED package structure to the fourth edge. A length of a side of the second target LED package structure perpendicular to the substrate edge is, for example, equal to or greater than a length of another side of the second target LED package structure parallel to the substrate edge.

In an embodiment of the present disclosure, the plurality of solder pads of the target LED package structure are overlapped with some or all of the LED chips of the plurality of light-emitting units of the target LED package structure.

In an embodiment of the present disclosure, an arrangement of the plurality of solder pads of the target LED package structure is an asymmetrical arrangement with respect to a geometric center of the target LED package structure in a distance direction from the first edge to the second edge.

In an embodiment of the present disclosure, the LED chips of different colors of each of the plurality of light-emitting units are MicroLED chips of different colors, the plurality of light-emitting units are arranged in a M×N array, an amount of the plurality of solder pads is determined by the M, the N and an amount of the LED chips of different colors of each of the plurality of light-emitting units, the M and the M each are a positive integer equal to or greater than 2.

In an embodiment of the present disclosure, a width of the border bonding region in a direction perpendicular to the substrate edge is greater than or equal to 40 μm and smaller than or equal to 250 μm.

In an embodiment of the present disclosure, the display panel further includes a chip on film (COF), an end of the COF is bonded onto the border bonding region to electrically connect with the driving substrate, and another end of the COF is bent to a rear side of the driving substrate to make a driving chip of the COF be located on the rear side of the driving substrate.

In still another aspect, an embodiment of the present disclosure provides a tiling-type display device including a plurality of display panels tiled together, and each of the plurality of display panels being the display panel of any one of foregoing embodiments. The plurality of display panels includes a first display panel and a second display panel adjacent to the first display panel, a target COF bonded onto the border bonding region of the first display panel passes through a gap between the driving substrate of the first display panel and the driving substrate of the second display panel and is bent to a rear side of the driving substrate of the first display panel, a first pixel pitch between the light-emitting unit of the first display panel near the target COF and the light-emitting unit of the second display panel near the target COF is consistent with a second pixel pitch of the plurality of light-emitting units of the first display panel.

Sum up, the above embodiments of the present disclosure, by designing the LED package structure, use the form of multiple light-emitting units (or pixels) in one package to reduce the number of solder pads, so that an edge of the package structure is retracted inwardly and the position of solder pad is moved inwards so as to provide sufficient space for subsequent border bonding, thereby effectively improving the bonding strength of the COF with the driving substrate and reducing the requirement on bonding accuracy.

BRIEF DESCRIPTION OF DRAWINGS

In order to illustrate technical solutions of embodiments of the present disclosure more clearly, drawings used in the description of the embodiments will be briefly introduced in the following. Apparently, the drawings in the following description are only some embodiments of the present disclosure, and those skilled in the art can also obtain other drawings according to these drawings without creative effort.

DETAILED DESCRIPTION OF EMBODIMENTS

Figure 1A:
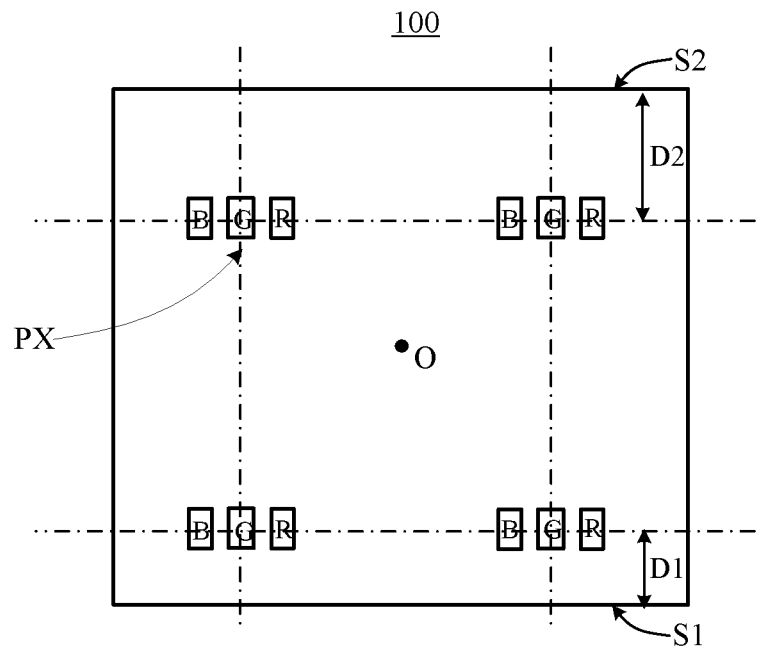
FIG. 1A illustrates a schematic front view of a LED package structure according to a first embodiment of the present disclosure.

In order to make purposes, technical solutions and advantages of embodiments of the present disclosure clearer, the technical solutions of the embodiments of the present disclosure will be clearly and completely described below with reference to the accompanying drawings. Apparently, the described embodiments are only some of embodiments of the present disclosure, rather than all of embodiments of the present disclosure. Based on the described embodiments of the present disclosure, all other embodiments obtained by those skilled in the art without creative effort shall fall within the scope of protection of the present disclosure.

It should be noted that all directional indications (such as upper, lower, left, right, front, rear, top and bottom) in embodiments of the present disclosure are only used to explain relative positional relationships and motions of components in a specific posture (as shown in the drawings), and if the specific posture changes, the directional indications also change accordingly. Furthermore, in the embodiments of the present disclosure and in the appended claims, the term "perpendicular" refers to an angle between two elements of 90 degrees and even with a deviation of −10 degrees to +10 degrees, the term "parallel" refers to an angle between two elements of 0 degree and even with a deviation of −10 degrees to +10 degrees, and the terms "in consistent with" refers to values of two elements are equal and even with a deviation of −10% to +10%.

In the described embodiments of the present disclosure, references to "first", "second", etc., are for descriptive purpose only and are not to be construed as indicating or implying relative importance or as implying the number of technical features indicated. Thus, the features defined with "first" and "second" may explicitly or implicitly include at least one of the features.

First Embodiment

Figure 1B:
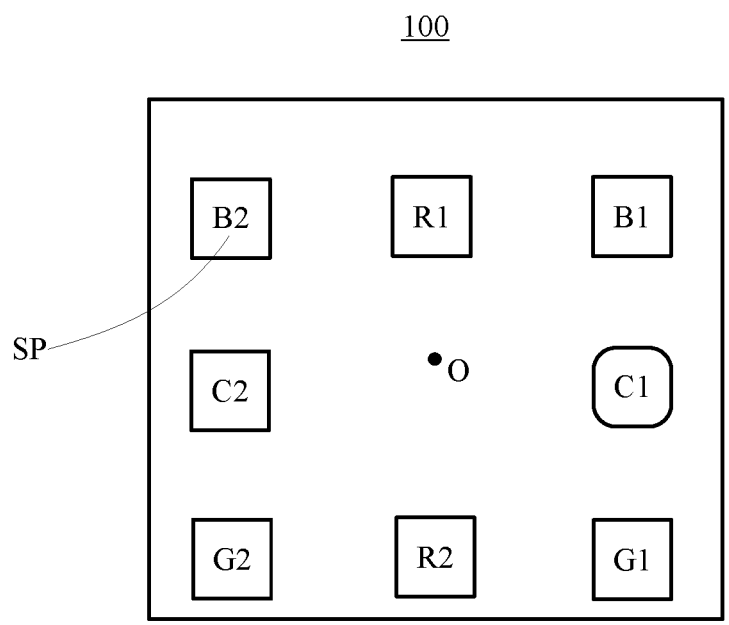
FIG. 1B illustrates a schematic rear view of the LED package structure according to the first embodiment of the present disclosure.

As illustrated in FIGS. 1A-1E, a LED package structure 100 according to the first embodiment of the present disclosure includes: multiple (i.e., more than one) light-emitting units PX, a package base 110, and an encapsulant layer (also referred to as encapsulation body) 130. A bottom side of the package base 100 is disposed with multiple solder pads SP, for example, solder pads C1, C2 serving as cathodes and solder pads R1, R2, G1, G2, B1, B2 serving as anodes, as shown in FIG. 1B. The multiple light-emitting units PX are disposed on a top side of the package base 100 in a 2×2 array. Each the light-emitting unit PX includes multiple LED chips of different colors, for example, a red LED chip R, a green LED chip G and a blue LED chip B. In other words, the LED package structure 100 according to the illustrated embodiment of the present disclosure is a package structure of multiple light-emitting units in one package (also referred to as MicroLED in Package (MiP)). The encapsulant layer 130 is disposed on the top side of the package base 110 and covering the multiple light-emitting units PX. The encapsulant layer 130 is made of, for example, a visible light transparent material such as epoxy resin or silicone. It is noted that, the multiple LED chips of different colors of each the light-emitting unit PX may be MicroLED chips, or LED chips of other sizes such as mini-LED chips. The amount of the multiple LED chips of different colors of each the light-emitting unit PX is not limited to three as shown in FIG. 1A, and can be other amount such as two or more than three. In some embodiments, the mini-LED chip typically is a chip with a length, a width and a thickness are all in a range of 100 μm to 200 μm, and the MicroLED chip typically is a chip with a length, a width and a thickness are all less than 100 μm. It should be noted that, each the LED chip structurally includes a semiconductor layer structure, and a P electrode and a N electrode disposed on the semiconductor layer structure; and each the LED chip may be flip-chip LED chip of which the P electrode and the N electrode are arranged on the same side of the semiconductor layer structure, or a vertical LED chip of which the P electrode and the N electrode are respectively arranged on two opposite sides of the semiconductor layer structure.

Figure 1C:
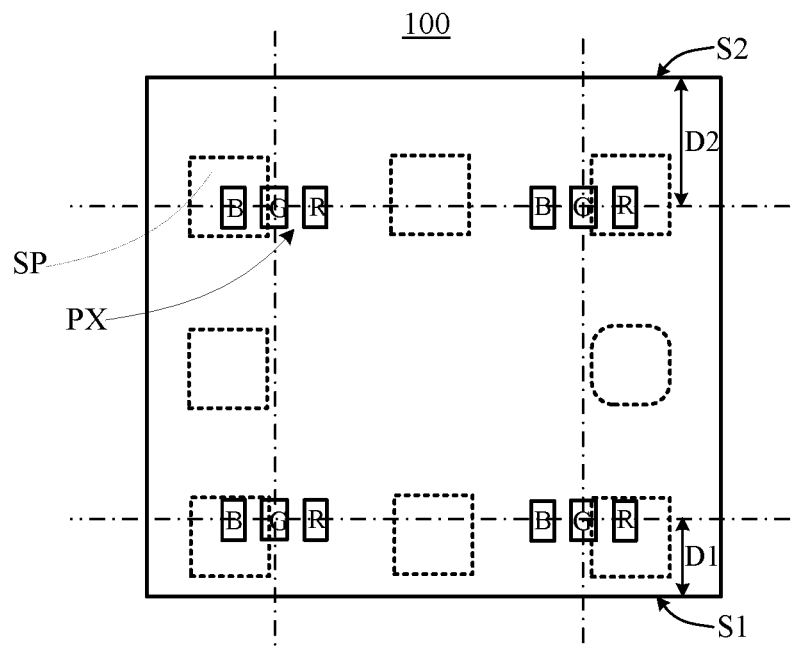
FIG. 1C illustrates a schematic combined view of multiple light-emitting units and multiple solder pads of the LED package structure according to the first embodiment of the present disclosure.

In some embodiments, the LED package structure 100 has a first edge Si and a second edge S2 opposite to the first edge S1. A distance D1 from a center point position of the light-emitting unit PX (e.g., the lower right light-emitting unit in FIG. 1A or FIG. 1C) closest to the first edge S1 among the multiple light-emitting units PX to the first edge S1 is not equal to a distance D2 from a center point position of the light-emitting unit PX (e.g., the upper right light-emitting unit in FIG. 1A or FIG. 1C) closest to the second edge S2 among the multiple light-emitting units PX to the second edge S2, for example, D1<D2. Herein, the center point position of the light-emitting unit PX typically is a geometric center position of the light-emitting unit PX, for example, an intersection point of a horizontal dash dot line with a vertical dash dot line in FIG. 1A or FIG. 1C. In other words, for the LED package structure 100 according to the illustrated embodiment, an arrangement of the multiple light-emitting units PX thereof is an asymmetric arrangement about a geometric center O of the LED package structure 100 in the direction from the first edge Si to the second edge S2. Specifically, in FIG. 1A, the two light-emitting units PX in the second row are farther from the geometric center O in the distance direction (i.e., the vertical direction in FIG. 1A) from the first edge S1 to the second edge S2 than the two light-emitting units PX in the first row. Correspondingly, as shown in FIG. 1B, an arrangement of the multiple solder pads SP of the LED package structure 100 is an asymmetric arrangement about the geometric center O of the LED package structure 100 in the distance direction from the first edge Si to the second edge S2. Moreover, it is noted that, as illustrated in FIG. 1C, the solder pads SP (e.g., the solder pads respectively located at four corners) are overlapped with some of the LED chips of the light-emitting units PX at corresponding positions, but the embodiments of the present disclosure are not limited thereto, and the solder pads SP can be overlapped with all of the LED chips in the light emitting units PX at the corresponding positions instead. In addition, it should be understood that, when a spacing between adjacent two light-emitting units PX is large, the solder pads SP may be designed to be non-overlapped with the light-emitting units PX instead.

Figure 1D:
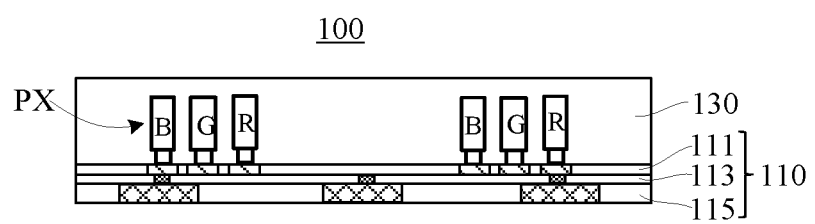
FIG. 1D illustrates a schematic cross-sectional view of the LED package structure according to the first embodiment of the present disclosure.

As illustrated in FIG. 1D, the package base 110 exemplarily includes a circuit layer 111, a solder pad layer 115, and a via layer 113 between the circuit layer 111 and the solder pad layer 115. Specifically, the R, G, B LED chips of each the light-emitting unit PX are, for example, surface-mounted on the circuit layer 111 to form a parallel connection and/or a series connection, the via layer 113 is formed with multiple vias therein, the solder pad layer 115 is formed with the multiple solder pads SP therein, and thus the multiple light-emitting units PX are electrically connected to the multiple solder pads SP through the circuit layer 11 and the vias in the via layer 113.

Figure 1E:
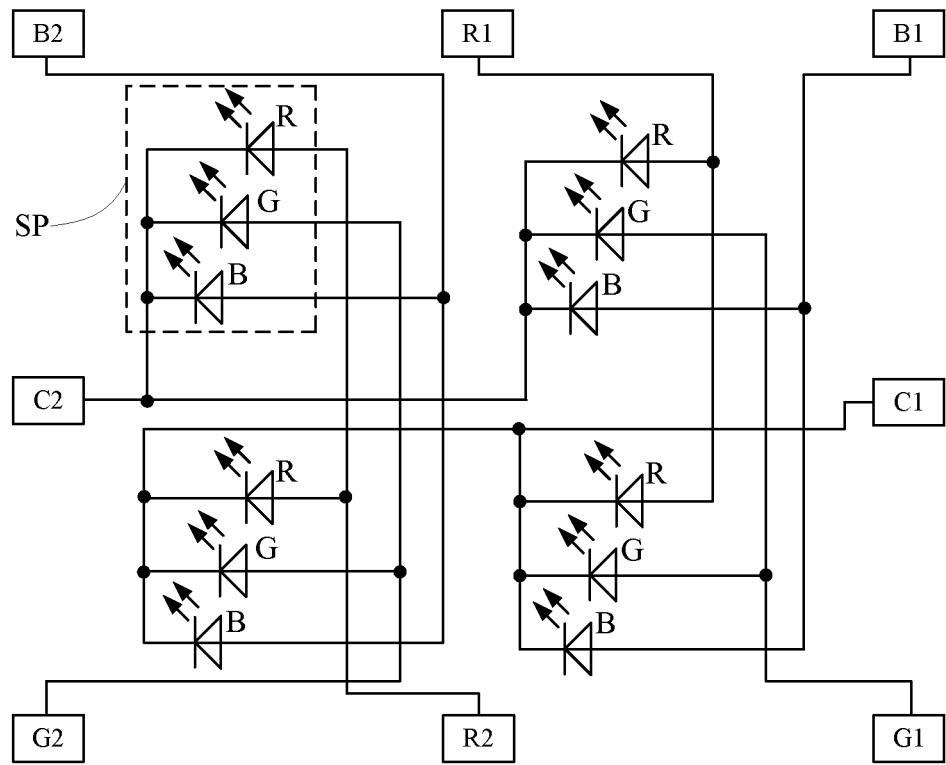
FIG. 1E illustrates a circuit diagram of the LED package structure according to the first embodiment of the present disclosure.

As illustrated in FIG. 1E, for four light-emitting units PX, anodes of two red LED chips R are electrically connected to the solder pad R1, anodes of the other two red LED chips R are electrically connected to the solder pad R2, anodes of two green LED chips G are electrically connected to the solder pad G1, anodes of the other two green LED chips G are electrically connected to the solder pad G2, anodes of two blue green LED chips B are electrically connected to the solder pad B1, anodes of the other two blue green LED chips B are electrically connected to the solder pad B2, cathodes of the two red LED chips R, the two green LED chips G and the two blue LED chips B of two light-emitting units PX are electrically connected to the solder pad C1, and cathodes of the two red LED chips R, the two green LED chips G and the two blue LED chips B of the other two light-emitting units PX are electrically connected to the solder pad C2. Therefore, it can be seen that the number/amount of the multiple solder pads SP of the LED package structure 100 is determined by the number M of rows and the number N of columns of the multiple light-emitting units PX as arranged and the number k of the multiple LED chips of different colors of each the light-emitting unit PX. For example, in FIG. 1E, the number of the multiple solder pads SP is 2+2*3=8, which corresponds to M=N=2 and k=3.

In addition, it should be noted that the number of the light-emitting units PX contained in the LED package structure 100 of some embodiments of the present disclosure is not limited to four, and may be more than four instead, such as 2×3 number of light-emitting units, 3×3 number of light-emitting units, 3×4 number of light-emitting units, 4×4 number of light-emitting units, or even more light-emitting units, depending on actual application requirements and a product yield. Generally, the higher the product yield is, the more the number of light-emitting units that can be integrated in a single package structure is. In addition, it is worth mentioning that, a LED package structure integrating with 2×3 number of light-emitting units is taken as an example, the number of solder pads may be 2+3*3=11, or 3+2*3=9.

Figure 1F:
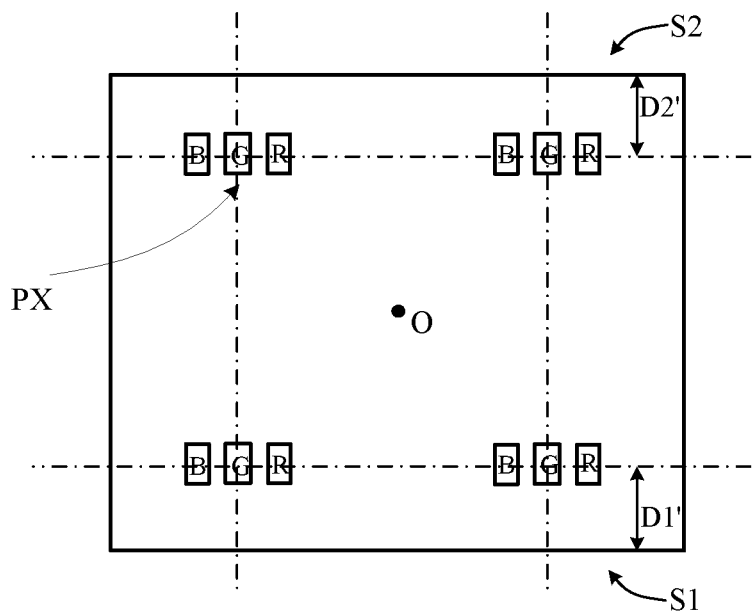
FIG. 1F illustrates a schematic front view of another LED package structure according to the first embodiment of the present disclosure.

It should be noted that, in other embodiments, among the multiple light-emitting units PX, a distance D1' from the center point position of the light-emitting unit PX (e.g., the lower right light-emitting unit in FIG. 1F) closest to the first edge S1 to the first edge S1 is equal to a distance D2' from the center point position of the light-emitting unit PX (e.g., the upper right light-emitting unit in FIG. 1F) closest to the second edge S2 to the second edge S2, namely, D1'=D2'.

In summary, the LED package structure 100 of the illustrated embodiments of the present disclosure uses a multi-in-one package form, which effectively reduces the number of solder pads. The four-in-one package form shown in FIGS. 1A-1E is taken as an example, only eight solder pads are needed, so that one light-emitting unit averagely burdens two solder pads, which reduces two solder pads compared with the prior art in which one pixel burdens four solder pads in the single pixel package, and therefore, the edge of the package structure is retracted inwardly and the position of the solder pads is moved inwards so as to provide sufficient space for subsequent border bonding.

Second Embodiment

Figure 2:
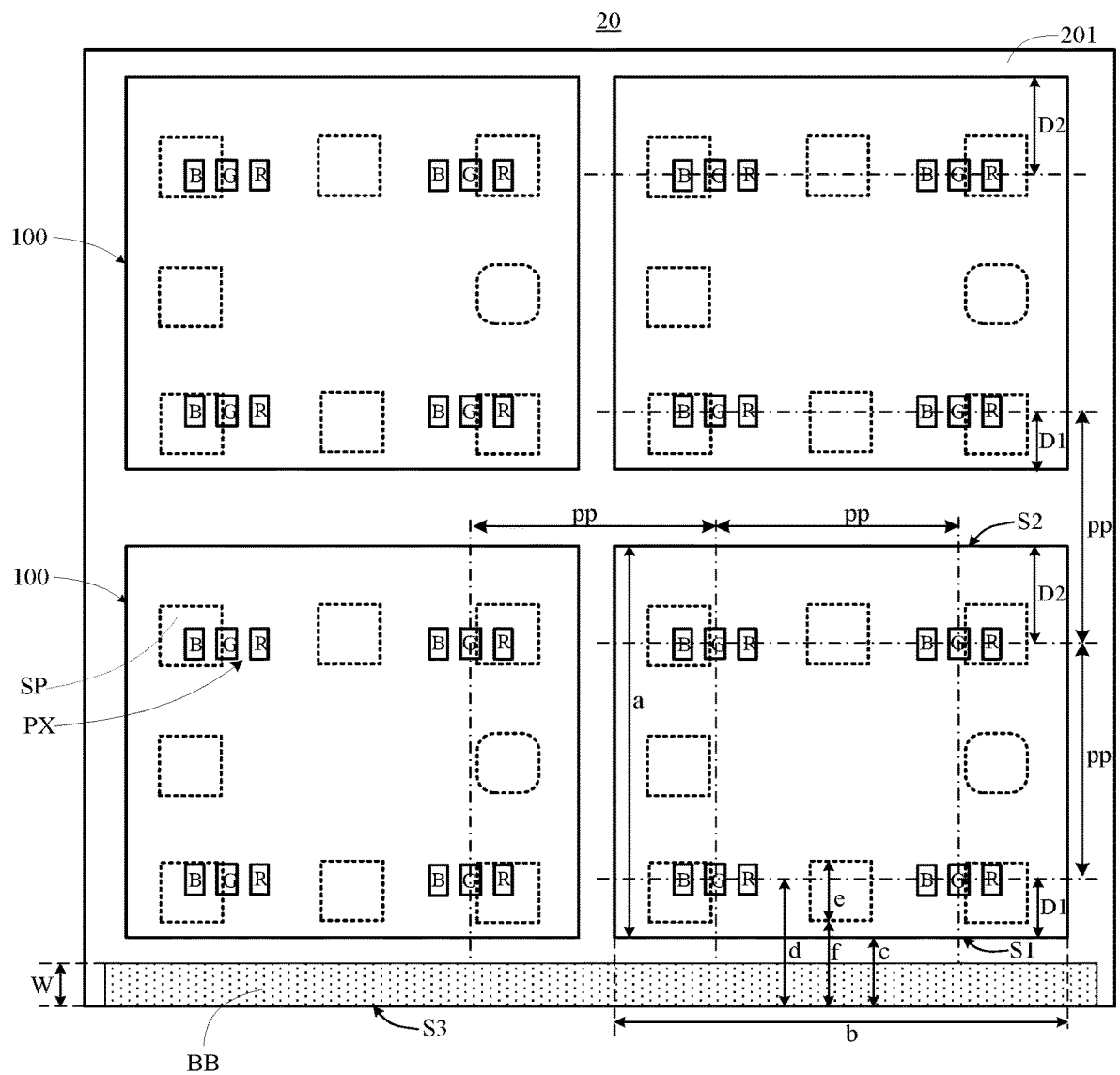
FIG. 2 illustrates a schematic structural view of a display panel being not bonded with a chip on film (COF) according to a second embodiment of the present disclosure.

As illustrated in FIG. 2, a display panel 20 according to the second embodiment of the present disclosure includes: a driving substrate (also referred to as driving backplate) such as a TFT array substrate (i.e., an active switch array substrate) 201, and LED package structures 100 mounted on the TFT array substrate 201. A side of the TFT array substrate 201 adjacent to a substrate edge S3 is provided with a border bonding region BB. Herein, descriptions of the respective LED package structures 100 can refer to the relevant description in the foregoing first embodiment, and thus will not be repeated herein. Moreover, the border bonding region BB is configured (i.e., structured and arranged) to be electrically connected to a chip on film (COF).

As shown in FIG. 2, the display panel 20 only illustrate four LED package structures 100 as an example for the purpose of description, but illustrated embodiments of the present disclosure are not limited to this, and thus the display panel can be disposed with other number of LED package structures 100. Moreover, each light-emitting unit PX in each of the LED package structures 100 is used as one pixel for image display, and as seen from FIG. 2, a pixel pitch of the display panel 20 is pp, which typically is in a range of 300 µm-450 µm. In addition, in the display panel 20, for the LED package structure 100 closest to the border bonding region BB, the lower right LED package structure 100 is taken as an example, a length of a side thereof perpendicular to the substrate edge S3 is a, a length of another side thereof parallel to the substrate edge S3 is b, a distance from the first edge S1 (i.e., the edge closest to the substrate edge S3) thereof to the substrate edge S3 is c, a distance from the center point position of the light-emitting unit (also referred to as a pixel) thereof closest to the substrate edge S3 to the substrate edge S3 is d, a length of a side perpendicular to the substrate edge S3 of the solder pad SP thereof closest to the substrate edge S3 is e, a distance from an edge adjacent to the substrate edge S3 of the solder pad SP thereof closest to the substrate edge S3 to the substrate edge S3 is f, and conditions that: (b−a)≤c, f≤d or d≤f, and (d−c)≤e or e≤(d−c) are satisfied. More specifically, for the display panel 20 with the LED package structures 100 each of which the multiple light-emitting units (also referred to as pixels) PX are arranged in a M×M (e.g., 2×2) array as illustrated in FIG. 2, in order to facilitate the assembly of the package structures onto the TFT array substrate, an outline of the package structure is generally square, so that the same kind of package structure can be easily applied widely; and in the illustrated embodiment of the present disclosure, in consideration of the tiling of the display panel, the solder pads SP at a bottom side of the LED package structure 100 are moved inwards to leave a space for cutting, and then a redundant edge portion of the LED package structure 100 is cut off, so that a border bonding space required for tiling can be obtained without damaging the device performance. Herein, the LED package structure 100 may be assembled/mounted on the TFT array substrate 201 after cutting the redundant edge portion, or may be assembled on the TFT array substrate 201 before cutting the redundant edge portion. Moreover, the condition (b−a)≤c represents a size of the space for border bonding provided by the LED package structure 100 through the structural design, so as to ensure the bonding strength of the COF with the TFT array substrate 201 and reduce the requirement on bonding accuracy; the condition f≤d represents the position of the solder pad SP of the LED package structure 100 is fan-out relative to the center point position of the light-emitting unit (i.e., pixel) PX, and the condition d≤f represents the position of the solder pad SP of the LED package structure 100 is fan-in relative to the center point position of the light emitting unit (i.e., pixel) PX; and the condition (d−c)≤e or e≤(d−c) represents the LED chips of the light-emitting units (i.e., pixels) PX in the LED package structure 100 may be overlapped with the solder pads SP. In addition, in some embodiments of the present disclosure, a width W of the border bonding region BB in a direction perpendicular to the substrate edge S3 is typically in a range of 40 µm-250 µm.

Figure 3:
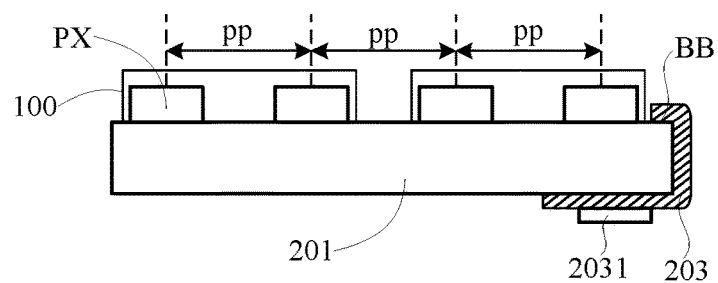
FIG. 3 illustrates a schematic structural view of the display panel being bonded with a COF according to the second embodiment of the present disclosure.

As illustrated in FIG. 3, a schematic structural view of the display panel being bonded with the COF 203 is shown. Specifically, an end of the COF 203 is bonded (e.g., through an anisotropic conductive film (abbreviated as ACF)) onto the border bonding region BB to form electrical connection with the TFT array substrate 201, the other end of the COF 203 is bent to the rear side of the TFT array substrate 201 of the display panel 20, and a driving chip 2031 on the COF 203 is generally arranged on the rear side of the TFT array substrate 201.

Figure 4A:
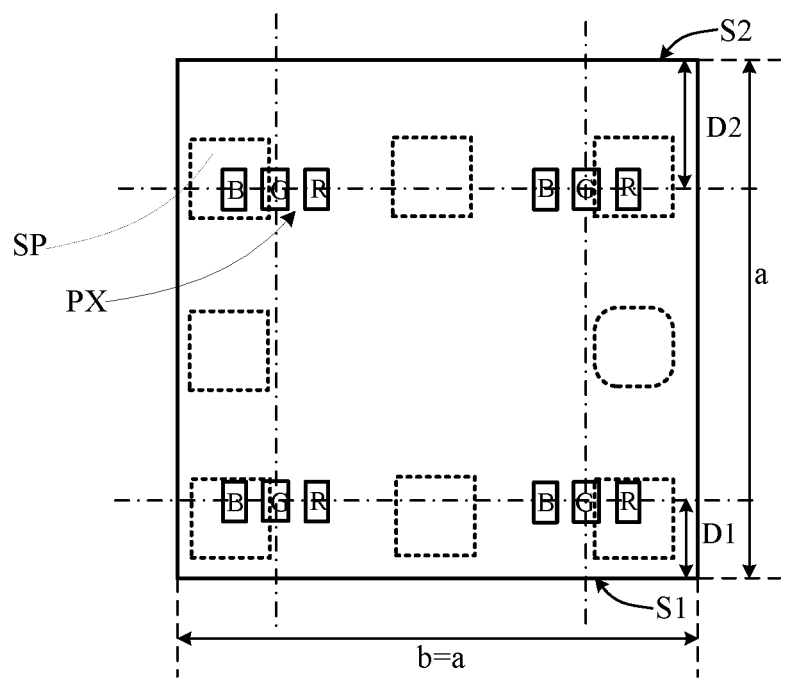
FIG. 4A illustrates a schematic combined view of multiple light-emitting units and multiple solder pads of a LED package structure according to another embodiment of the present disclosure.
Figure 4B:
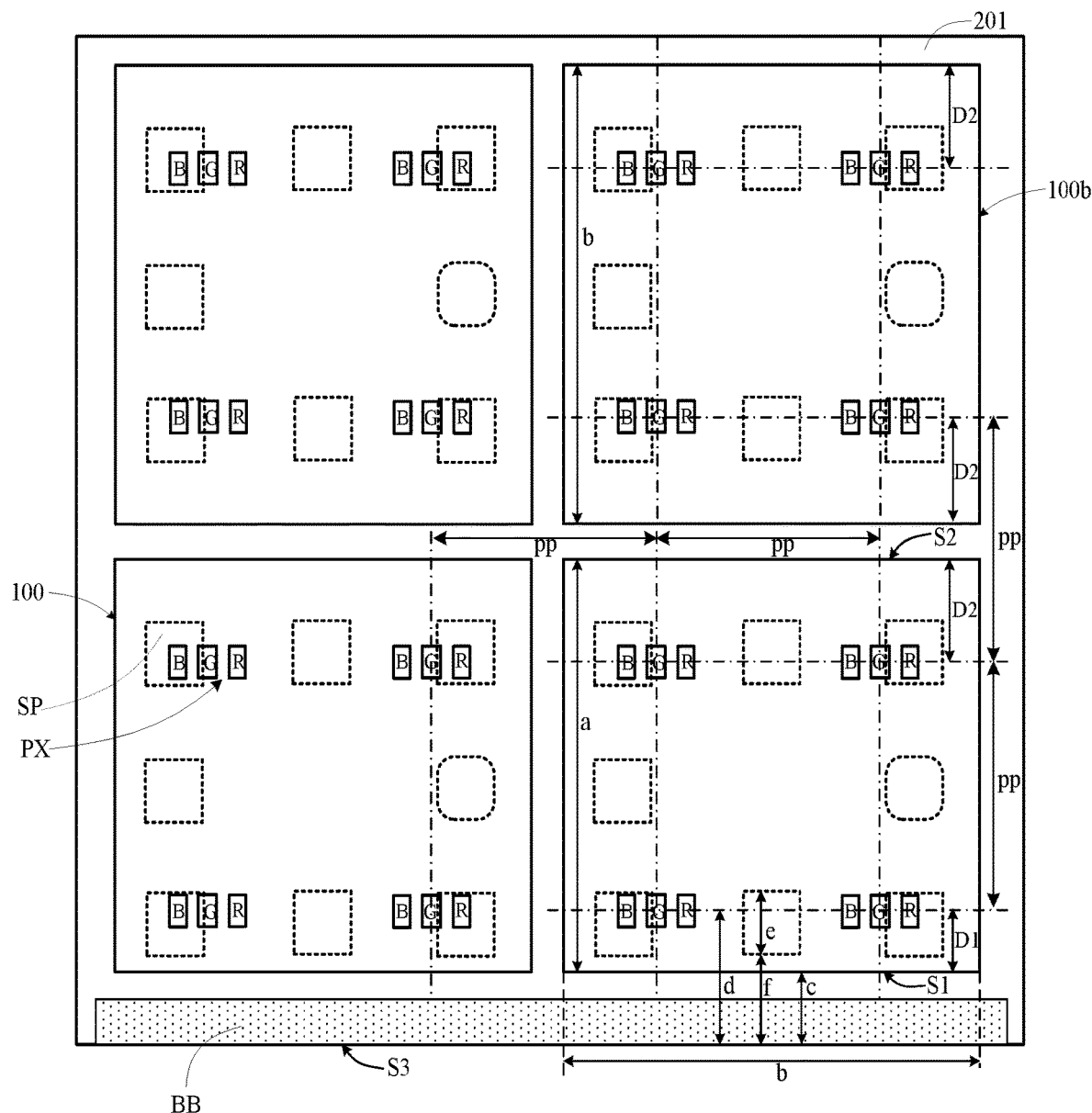
FIG. 4B illustrates a schematic structural view of a display panel being not bonded with a COF according to some embodiments of the present disclosure.

In the LED package structure 100 using the form of M×M (e.g., 2×2) multi-in-one package as illustrated in FIG. 2, M+M*k (e.g., 2+2*3=8) solder pads SP are employed, the size of the package structure is reduced in a direction approaching the substrate edge S3 of the TFT array substrate to produce an asymmetric package form of a<b, thereby increasing the space used for border bonding. It should be understood that, in another embodiment, for the LED package structure 100 using the form of M×M multi-in-one package, the two side lengths of the package structure are both reduced, for example, as illustrated in FIG. 4A, to reduce the size of the package structure wholly, thereby producing a symmetrical package form of b=a to increase the space used for border bonding. In addition, in still another embodiment, the display panel is assembled with two different kinds of LED package structures, for example, as illustrated in FIG. 4B, the LED package structures near the border bonding region BB each use the LED package structure 100 (corresponding to the asymmetric package form of a<b) as illustrated in FIG. 2 to provide sufficient space required for border bonding, and the other LED package structures farther from the border bonding region BB each use a LED package structure 100b with the symmetrical package form (both side lengths are b), which still can achieve the purpose of providing sufficient space required for border bonding. More specifically, for the display panel illustrated in FIG. 4B, four LED package structures 100b are firstly assembled onto the TFT array substrate 201, and then redundant edge portions near the border bonding region BB, of the two LED package structures near the border bonding region BB, are cut off to obtain the two LED package structures 100 illustrated in FIG. 4B.

In addition, it should be understood that the display panel 20 according to the second embodiment of the present disclosure is not limited to use the LED package structures 100/100b with the form of M×M multi-in-one package, and may use a LED package structure with the form of M×N (N≠M) multi-in-one package, such as a LED package structure with the form of 2×3 multi-in-one package, a LED package structure with the form of 3×4 multi-in-one package, etc., and correspondingly an outline of the LED package structure is rectangular.

Figure 4C:
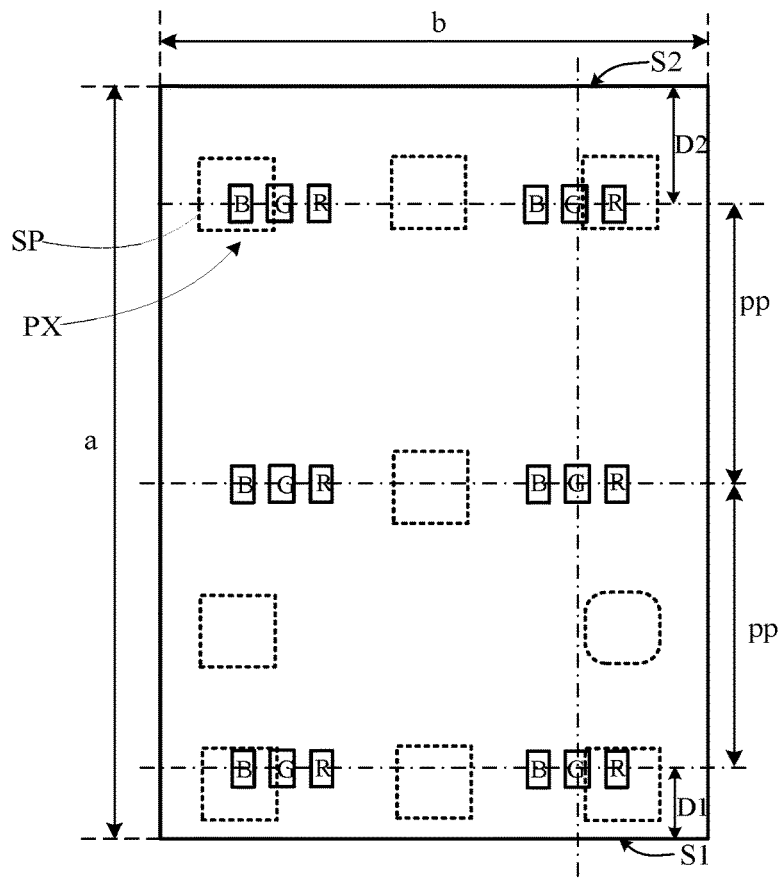
FIG. 4C illustrates a schematic combined view of multiple light-emitting units and multiple solder pads of a LED package structure according to still another embodiment of the present disclosure.

Moreover, it should be noted that, in even still another embodiment, the LED package structure according to some embodiments of the present disclosure may be designed to be an asymmetrical package form of a>b, for example, as illustrated in FIG. 4C. In particular, the LED package structure as shown in FIG. 4C is integrated with 3×2 number of light-emitting units (i.e., pixels) PX, and the number of its solder pads is 3+2*3=9. A length of a side of the LED package structure perpendicular to the substrate edge S3 (referring to FIG. 2 or FIG. 4B) is a, a length of another side of the LED package structure parallel to the substrate edge S3 is b, and a>b. Since this embodiment uses the asymmetrical design that the distance D1 from the center point position of the light-emitting unit PX closest to the first edge 51 among multiple light-emitting units PX to the first edge 51 is not equal to (e.g., smaller than) the distance D2 from the center point position of the light-emitting unit PX closest to the second edge S2 among the multiple light-emitting units PX to the second edge S2, it can also achieve the purpose of providing sufficient space for the subsequent border bonding.

Third Embodiment

Figure 5A:
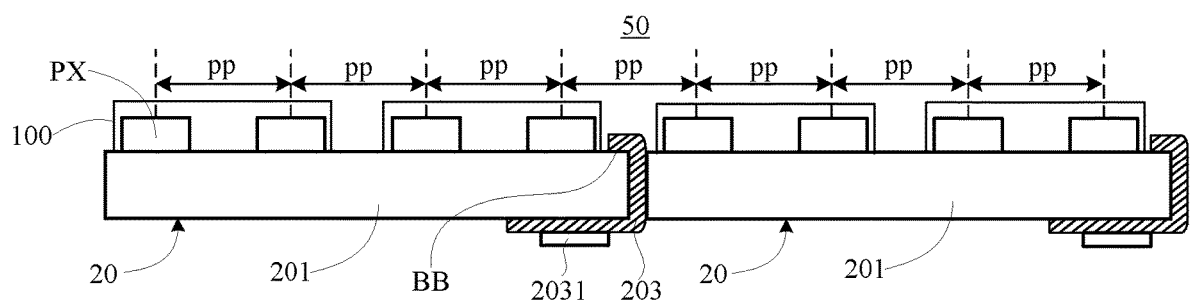
FIG. 5A illustrates a schematic structural view of a tiling-type display device according to a third embodiment of the present disclosure.
Figure 5B:
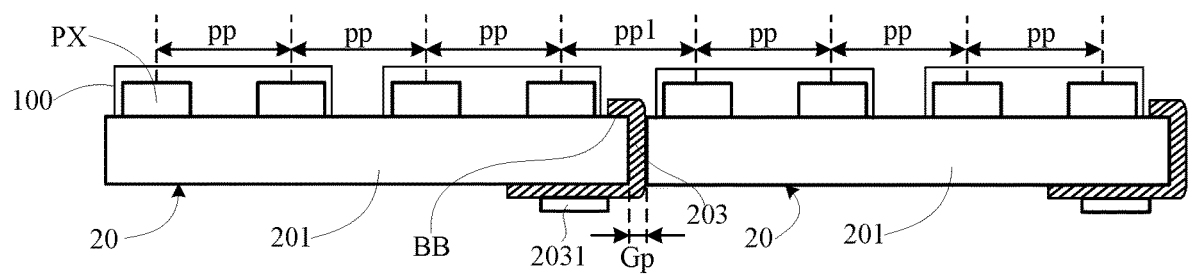
FIG. 5B illustrates a schematic structural view of another tiling-type display device according to the third embodiment of the present disclosure.

As illustrated in FIG. 5A and FIG. 5B, a tiling-type display device 50 according to the third embodiment of the present disclosure includes multiple display panels 20 tiled together. Each the display panel 20 includes: a driving substrate such as a TFT array substrate 201, multiple LED package structures 100 mounted on the TFT array substrate 201, and a COF 203 bonded onto a border bonding region BB of the TFT array substrate 201. A gap between the TFT array substrates 201 of adjacent two of the multiple display panels 20 has the COF 203 arranged therein, that is, the COF 203 passes through the gap and then is bent to the rear side of one TFT array substrate 201. As seen from FIG. 5A and FIG. 5B, the adjacent two display panels 20 are respectively located on opposite sides of the COF 203 passing through the gap, and a pixel pitch between the light-emitting units (i.e., pixels) near the COF 203 is equal to (as illustrated in FIG. 5A) or approximately equal to (as illustrated in FIG. 5B) pp, that is, in consistent with the pixel pitch of the light-emitting units (i.e., pixels) of each the display panel 20, so as to avoid the generation of bright and dark lines during image display. Of course, it should be understood that, for the display panels 20 of the tiling-type display device 50 each can be replaced by the display panel as illustrated in FIG. 4B, or the display panels of the tiling-type display device 50 each can employ the LED package structure as illustrated in FIG. 4A. Moreover, for the case that the pixel pitch pp1 between the light-emitting units (i.e., pixels) of the adjacent two display panels 20 located on the opposite two sides of the COF 203 passing through the gap respectively and near the COF 203 is approximately equal to pp, it is, for example, pp >pp1; typically, a value of the pp is in a range of 300 μm-450 μm, and a value of the pp1 is in a range of 250 μm-400 μm; and preferably, 0.85≤pp1/pp<1. In addition, as seen from FIG. 5B, a width Gp of the gap between the TFT array substrates 201 of the adjacent two display panels 20 satisfies that Gp<pp1, and a value of the Gp typically is in a range of 100 μm-150 μm.

In addition, it should be understood that, the foregoing embodiments are only exemplary descriptions of the present disclosure, and the technical solutions of the embodiments may be arbitrarily combined or collocated on the premise that technical features do not conflict with each other, structures do not contradict with each other, and the inventive purpose of the present disclosure is not violated.

Finally, it should be noted that the above embodiments are only used to illustrate technical solutions of the present disclosure, not to limit the present disclosure. Although the present disclosure has been described in detail with reference to the foregoing embodiments, those of ordinary skill in the art should understand that they can make modifications on the technical solutions described in the foregoing embodiments, or make equivalent substitutions on some of technical features thereof. These modifications or substitutions do not make the essence of corresponding technical solutions deviate from the spirit and scope of the technical solutions of the embodiments of the present disclosure.

What is claimed is:

1. A light-emitting diode (LED) package structure, comprising: a package base, a plurality of light-emitting units, and an encapsulant layer;

wherein a first side of the package base is disposed with a plurality of solder pads, the plurality of light-emitting units are disposed on a second side of the package base opposite to the first side and electrically connected to the plurality of solder pads, the encapsulant layer is arranged on the second side of the package base and covering the plurality of light-emitting units, and each of the plurality of light-emitting units comprises LED chips of different colors;

wherein the LED package structure has a first edge and a second edge opposite to the first edge, and a distance from a center point position of the light-emitting unit closest to the first edge among the plurality of light-emitting units to the first edge is different from a distance from a center point position of the light-emitting unit closest to the second edge among the plurality of light-emitting units to the second edge.

2. The LED package structure as claimed in claim 1, wherein the LED chips of different colors of each of the plurality of light-emitting units are MicroLED chips of different colors, the plurality of light-emitting units are arranged in a MxN array, an amount of the plurality of solder pads is determined by the M, the N and an amount of the LED chips of different colors of each of the plurality of light-emitting units, the M and the M each are a positive integer equal to or greater than 2; and the plurality of solder pads are overlapped with some or all of the LED chips of the plurality of light-emitting units.

3. The LED package structure as claimed in claim 1, wherein an arrangement of the plurality of solder pads is an asymmetrical arrangement with respect to a geometric center of the LED package structure in a distance direction from the first edge to the second edge.

4. The LED package structure as claimed in claim 1, wherein in a distance direction from the first edge to the second edge, a distance between adjacent two light-emitting units among the plurality of light-emitting units is in a range of 300 micrometers (μm) to 450 μm.

5. A display panel, comprising: a driving substrate and a plurality of LED package structures mounted on the driving substrate;

wherein each of the plurality of LED package structures comprises a package base, a plurality of light-emitting units and an encapsulant layer; a first side of the package base is disposed with a plurality of solder pads, the plurality of light-emitting units are disposed on a second side of the package base opposite to the first side and electrically connected to the plurality of solder pads, the encapsulant layer is arranged on the second side of the package base and covering the plurality of light-emitting units, and each of the plurality of light-emitting units comprises LED chips of different colors;

wherein the driving substrate has a substrate edge, and a side of the driving substrate near the substrate edge is disposed with a border bonding region; a target LED package structure closest to the substrate edge among the plurality of LED package structures has a first edge facing towards the substrate edge and a second edge opposite to the first edge, the border bonding region is located between the substrate edge and the first edge, and a distance from a center point position of the light-emitting unit closest to the first edge among the plurality of light-emitting units of the target LED package structure to the first edge is smaller than a distance from a center point position of the light-emitting unit closest to the second edge among the plurality of light-emitting units of the target LED package structure to the second edge.

6. The display panel as claimed in claim 5, wherein a length of a side the target LED package structure perpendicular to the substrate edge is a, a length of another side of the target LED package structure parallel to the substrate edge is b, a distance from the first edge of the target LED package structure to the substrate edge is c, and conditions that (b−a)≤c and a<b are satisfied.

7. The display panel as claimed in claim 5, wherein a length of a side the target LED package structure perpendicular to the substrate edge is equal to a length of another side of the target LED package structure parallel to the substrate edge.

8. The display panel as claimed in claim 5, wherein a length of a side the target LED package structure perpendicular to the substrate edge is a, a length of another side of the target LED package structure parallel to the substrate edge is b, and a condition that a>b is satisfied.

9. The display panel as claimed in claim 5, wherein a second target LED package structure among the plurality of LED package structures farther away from the substrate edge than the target LED packaging structure has a third edge facing towards the substrate edge and a fourth edge opposite to the third edge, and a distance from a center point position of the light-emitting unit closest to the third edge among the plurality of light-emitting units of the second target LED package structure to the third edge is smaller than a distance from a center point position of the light-emitting unit closest to the fourth edge among the plurality of light-emitting units of the second target LED package structure to the fourth edge.

10. The display panel as claimed in claim 5, wherein a second target LED package structure among the plurality of LED package structures farther away from the substrate edge than the target LED packaging structure has a third edge facing towards the substrate edge and a fourth edge opposite to the third edge, and a distance from a center point position of the light-emitting unit closest to the third edge among the plurality of light-emitting units of the second target LED package structure to the third edge is equal to a distance from a center point position of the light-emitting unit closest to the fourth edge among the plurality of light-emitting units of the second target LED package structure to the fourth edge.

11. The display panel as claimed in claim 5, wherein the plurality of solder pads of the target LED package structure are overlapped with some or all of the LED chips of the plurality of light-emitting units of the target LED package structure.

12. The display panel as claimed in claim 5, wherein an arrangement of the plurality of solder pads of the target LED package structure is an asymmetrical arrangement with respect to a geometric center of the target LED package structure in a distance direction from the first edge to the second edge.

13. The display panel as claimed in claim 5, wherein the LED chips of different colors of each of the plurality of light-emitting units are MicroLED chips of different colors, the plurality of light-emitting units are arranged in a M×N array, an amount of the plurality of solder pads is determined by the M, the N and an amount of the LED chips of different colors of each of the plurality of light-emitting units, the M and the M each are a positive integer equal to or greater than 2.

14. The display panel as claimed in claim 5, wherein a width of the border bonding region in a direction perpendicular to the substrate edge is greater than or equal to 40 μm and smaller than or equal to 250 μm.

15. The display panel as claimed in claim 5, wherein the display panel further comprises a chip on film (COF), an end of the COF is bonded onto the border bonding region to electrically connect with the driving substrate, and another end of the COF is bent to a rear side of the driving substrate to make a driving chip of the COF be located on the rear side of the driving substrate.

16. The display panel as claimed in claim 5, wherein a distance between center point positions of adjacent two light-emitting units of the plurality of light-emitting units of the target LED package structure in a distance direction from the first edge to the second edge is in a range of 300 μm to 450 μm.

17. A tiling-type display device comprising a plurality of display panels tiled together, and each of the plurality of display panels being the display panel as claimed in claim 5;
wherein the plurality of display panels comprises a first display panel and a second display panel adjacent to the first display panel, a target COF bonded onto the border bonding region of the first display panel passes through a gap between the driving substrate of the first display panel and the driving substrate of the second display panel and is bent to a rear side of the driving substrate of the first display panel, a first pixel pitch between the light-emitting unit of the first display panel near the target COF and the light-emitting unit of the second display panel near the target COF is consistent with a second pixel pitch of the plurality of light-emitting units of the first display panel.

18. The tiling-type display device as claimed in claim 17, wherein a ratio of the first pixel pitch to the second pixel pitch is greater than or equal to 0.85 and smaller than 1.

19. The tiling-type display device as claimed in claim 18, wherein the first pixel pitch is in a range of 300 μm to 450 μm, the second pixel pitch is in a range of 250 μm to 400 μm, and a width of the gap between the driving substrate of the first display panel and the driving substrate of the second display panel is in a range of 100 μm to 150 μm.

20. A tiling-type display device comprising a plurality of display panels tiled together, and each of the plurality of display panels comprising a driving substrate and a plurality of LED package structures mounted on the driving substrate;
wherein each of the plurality of LED package structures comprises a package base, a plurality of light-emitting units and an encapsulant layer; a first side of the package base is disposed with a plurality of solder pads, the plurality of light-emitting units are disposed on a second side of the package base opposite to the first side and electrically connected to the plurality of solder pads, the encapsulant layer is arranged on the second side of the package base and covering the plurality of light-emitting units, and each of the plurality of light-emitting units comprises LED chips of different colors;
wherein the driving substrate has a substrate edge, and a side of the driving substrate near the substrate edge is disposed with a border bonding region; any one of the plurality of LED package structures has a first edge facing towards the substrate edge and a second edge opposite to the first edge, the border bonding region is located between the substrate edge and the first edge, and a distance from a center point position of the light-emitting unit closest to the first edge among the plurality of light-emitting units of the any one of the plurality of LED package structures to the first edge is smaller than or equal to a distance from a center point position of the light-emitting unit closest to the second edge among the plurality of light-emitting units to the second edge;
wherein the plurality of display panels comprises a first display panel and a second display panel adjacent to the first display panel, a COF bonded onto the border bonding region of the first display panel passes through a gap between the driving substrate of the first display panel and the driving substrate of the second display panel and is bent to a rear side of the driving substrate of the first display panel, and a ratio of a first pixel pitch between the light-emitting unit of the first display panel near the COF and the light-emitting unit of the second display panel near the COF to a second pixel pitch of the plurality of light-emitting units of the first display panel is greater than or equal to 0.85 and smaller than 1;
wherein the first pixel pitch is in a range of 300 μm to 450 μm, and the second pixel pitch is in a range of 250 μm to 400 μm.

* * * * *